United States Patent [19]

Cresswell et al.

[11] Patent Number: 5,373,232

[45] Date of Patent: Dec. 13, 1994

[54] METHOD OF AND ARTICLES FOR ACCURATELY DETERMINING RELATIVE POSITIONS OF LITHOGRAPHIC ARTIFACTS

[75] Inventors: Michael W. Cresswell, Frederick; Richard A. Allen, Germantown; Loren W. Linholm, Ijamsville; Colleen H. Ellenwood, Mt. Airy; William B. Penzes, New Carrollton; E. Clayton Teague, Gaithersburg, all of Md.

[73] Assignee: The United States of America as represented by the Secretary of Commerce, Washington, D.C.

[21] Appl. No.: 34,782

[22] Filed: Mar. 19, 1993

Related U.S. Application Data

[63] Continuation-in-part of Ser. No. 852,439, Mar. 13, 1992.

[51] Int. Cl.$^5$ ............... G01R 31/00; G01R 27/00; G03C 5/06
[52] U.S. Cl. ............... 324/158.1; 324/716; 430/30
[58] Field of Search ............... 324/158 R, 716, 719, 324/73.1; 437/8; 430/30; 257/48

[56] References Cited

U.S. PATENT DOCUMENTS

| 3,650,020 | 3/1972 | Mar | 437/8 |
| 4,347,479 | 8/1982 | Cullet | 324/158 R |
| 4,386,459 | 6/1983 | Boulin | 324/158 R |
| 4,399,205 | 8/1983 | Bergendahl | 430/30 |

OTHER PUBLICATIONS

Teague, "The National Institute of Standards and Technology Molecular Measuring Machine Project; Metrology and Precision Engineering Design", Journal of Vacuum Science Technology, vol.-B7, No. 6, 1989, pp. 1989-1902.

Cresswell et al, "A Modified Sliding Wire Potentiometer Test Structure For Mapping Nanometer-Level Distances", IEEE 1991 Conference on Microelectronic Test Structures, vol. 4, No. 1, 1991, pp. 129-134.

Allen et al, "Elimination Of Effects Due To Patterning Imperfections In Electrical Test Structures For Submicrometer Feature Metrology", Solid-State Electronics, vol. 35, No. 3, 1992, pp. 435-442.

Allen et al, "Voltage-Dividing Potentiometer Enhancements For High-Precision Feature Placement Metrology", IEEE 1992 International Conference on Microelectronic Test Structures, vol. 5, pp. 174-179.

Allen et al, "A New Test Structure For The Electrical Measurement Of The Width Of Short Features With Arbitrarily Wide Voltage Taps", IEEE Electron Device Letters, vol. 12, No. 6, 1992, pp. 322-324.

*Primary Examiner*—Ernest F. Karlsen
*Attorney, Agent, or Firm*—Leydig, Voit & Mayer

[57] ABSTRACT

A prepatterned potentiometer precursor includes a precursor substrate; and at least two spaced apart potentiometer precursor patterns on the substrate, each potentiometer precursor pattern including a bridge, two substantially similar end taps transverse to and extending from the bridge, and a center tap transverse to and extending from the bridge and centrally disposed between the end taps wherein the center taps of the bridges are substantially parallel to each other and are substantially wider than the end taps. A method of determining the distance between test features of test patterns on a test piece includes preparing a precursor substrate including at least two electrically conducting spaced apart potentiometer precursor patterns, each potentiometer precursor pattern including a bridge, two substantially similar end taps transverse to and extending from the bridge, and a center tap transverse to and extending from the bridge and centrally disposed between the end taps.

16 Claims, 5 Drawing Sheets

METHOD OF AND ARTICLES FOR ACCURATELY DETERMINING RELATIVE POSITIONS OF LITHOGRAPHIC ARTIFACTS This disclosure is a continuation-in-part of U.S. patent application Ser. No. 07/852,439, filed Mar. 13, 1992.

FIELD OF THE INVENTION

The present invention concerns a method of and articles for accurately determining the distance between, i.e., relative positions of, electrically conducting artifacts on a substrate that are defined in a lithographic process. More particularly, the invention concerns electrically determining the distance between electrically conducting artifacts relatively widely spaced apart, for example, spaced apart by ten millimeters, with an accuracy better than one hundred nanometers, thereby accurately determining the distance between test features of a lithographic mask.

BACKGROUND OF THE INVENTION

Large scale integrated circuits (LSIs) are continually becoming increasingly complex with ever increasing numbers of circuit elements, such as transistors, passive elements, such as resistors and capacitors, and metal interconnections. Consequently, the overall size of complex LSI chips is increasing. This trend requires increasing accuracy in the lithographic processes that are employed to manufacture LSIs.

Typically, large scale integrated circuits are manufactured using a series of masks in lithographic processes to form successive patterns of materials on and regions in individual chips comprising a semiconductor wafer, thereby defining circuit elements of the chips. In the lithography process cycles, a semiconductor wafer is typically covered with a resist film that is responsive to incident energy. The resist film is selectively exposed to the energy in desired areas by projecting an energy beam through a mask or by direct irradiation of the resist film with the energy beam. When a mask is used, the mask includes energy transmissive and non-transmissive portions forming a pattern to transmit the incident energy selectively and thereby produce a desired image on the resist film. The resist film changes in its chemical characteristics in response to exposure to the incident energy beam that is transmitted through the mask. Following the selective exposure to the incident energy, the resist film is developed, leaving in place parts of the resist film that have been exposed (or that have not been exposed depending upon the characteristic of the resist film) to the incident energy beam. The remaining parts of the resist film cover underlying areas of the substrate so that subsequent processes can be carried out in selected areas of the semiconductor wafer. These processes include etching, ion implantation, metallization, and so forth. In direct irradiation of a resist film, for example, by an electron beam without a mask, the energy beam is directed across the resist film in a predetermined pattern to expose the resist film selectively. Subsequent processing using the exposed resist film is the same as when the resist film is exposed through a mask.

In the traditional lithography processes used in integrated circuit processing and in other applications, the energy-responsive resist film exposed through a mask has been a photoresist film that is responsive to light, including visible light and/or ultraviolet light. Ultraviolet light, with its shorter wavelength, permits improved resolution of the images formed on the resist film so that smaller features can be formed as compared to resist films responsive to visible light. More recently developed techniques employ resist films that are sensitive to the energies associated with electron beams and x-rays, permitting still further resolution improvements and reduction in the sizes of the images formed on the resist films. Currently, these advanced techniques permit the formation of images as small as a few tenths of micrometers.

With expected increases in LSI complexity and the inclusion of larger numbers of circuit elements on a single chip, still smaller images will have to be formed on chips and the chips will have a larger size. For example, a dynamic random access memory (DRAM) having a one megabit capacity currently formed on a single chip requires the reproduction of lithographic images having dimensions as small as about one micrometer. A DRAM with a one Gigabit capacity, even if produced on a very large chip, for example, thirty millimeters by thirty millimeters, is projected to require minimum lithographic image dimensions of about two hundred nanometers. In order to manufacture LSIs using images that are so small with a reasonable yield, the placement accuracy of the features on a semiconductor wafer must be measurable to at least tens of nanometers and preferably less than ten nanometers.

The metrological accuracy, i.e., less than ten nanometers, required to produce integrated circuits having the expected future integration density can presently be achieved with optical apparatus available at only a few locations in the world, i.e., national laboratories, such as The National Institute of Standards and Technology (NIST) in Gaithersburg, Md., and a few very large corporations. The cost of including such a capability in a semiconductor wafer fabrication facility is currently very high. That cost could ultimately prevent progress in the production of ever more highly integrated LSIs. Optical measurement of the placement accuracy of artifacts on a substrate produced lithographically, with or without a mask, to accuracies of about fifty nanometers consumes substantial amounts of time, for example, one week per substrate. That long delay in confirming the accuracy of a mask is not compatible with an LSI manufacturing environment in which hundreds of masks may be prepared each day. Accordingly, continued development of metrology techniques for improving the accuracy of measurements of the positions of artifacts formed lithographically, including by photolithography, electron beam lithography, and x-ray beam lithography, at reasonable cost must be developed to promote continued progress in the semiconductor device integrated circuit arts.

One technique that has been developed in recent years for determining the relative position of one artifact on a substrate relative to other artifacts on a substrate with a high degree of accuracy without the use of optical instruments employs a voltage-dividing potentiometer. A voltage-dividing potentiometer is formed from an electrically conducting layer on a substrate. The potentiometer includes includes a bridge for conducting current and multiple taps that extend from the bridge for measuring the division of voltages along the bridge. A voltage-dividing potentiometer is shown in concept in FIG. 1. There, a bridge 1 has a current I flowing through it. Taps 2, 3, and 4 are in contact with the bridge 1 and extend transverse to it at various locations along the bridge 1. The end taps 3 and 4 are separated by a length L. The center tap 2 is centrally disposed between the end taps 3 and 4. Generally, the center line of the center tap 2 is offset from the midpoint of the length L by a distance x. The voltage $V_1$ between taps 2 and 3 and the voltage $V_2$ between taps 2 and 4 are both measured. From those measurements, assuming the uniformity of the bridge 1, the offset of the center tap 2 from the midpoint between the end taps 3 and 4 can be determined. The measurements are entirely electrical and no optical apparatus is required to make the positional determinations.

This voltage-dividing potentiometer technique has been applied in various forms to semiconductor wafers in order to determine the position of an electrically conductive artifact with respect to two other electrically conductive artifacts, for example, the end taps. Schematic examples of the geometry of several voltage-dividing potentiometers that have been tested for use in semiconductor device processing applications are illustrated in FIG. 2. In each of the four examples, current is conducted through a bridge while voltages are measured between pairs of taps extending from the bridge. The taps each include a probing pad and the bridge includes two pads. The pads are contacted mechanically by respective electrical probes for supplying current to the bridge and for measuring the voltage differences between pairs of taps.

The voltage-dividing potentiometer technique has important practical and economic advantages. With a voltage-dividing potentiometer, the position of a center tap relative to the center position between two end taps can be determined simply by electrical measurements. No optical instrument having a resolution on the order of ten nanometers is required to make measurements to an accuracy of one hundred nanometers or better. In practice, voltage-dividing potentiometers can be formed lithographically on any substrate bearing an electrically conducting film. After formation, the potentiometer is subjected to probing, i.e., the contacting of probes to the various pads, and evaluation of the measured voltages to determine the relative positioning of the electrically conducting taps formed by lithography. Electrical test equipment for probing the pads of a voltage-dividing potentiometer and evaluating the measured voltages is far less expensive than an optical instrument providing the same measurement accuracy (e.g., $250,000 versus $5,000,000). As LSI technology progresses toward more complex circuitry with smaller circuit elements, the cost advantage electrical determination of artifact position over optical determination should increase.

In older applications of the potentiometer technique, the bridge between the two end taps of a voltage-dividing potentiometer is long relative to the widths of the bridge and of the taps. However, as the length of the bridge has become shorter, for example, ten micrometers, for measurements in smaller areas of a substrate, that length has become comparable to the widths of the bridge and taps, for example, one to two micrometers. These dimensional relationships affect the voltage measurements made with a potentiometer. Substantial research into the effects of taps of widths comparable to the bridge length has shown that the relatively wide taps shorten the effective length of the bridge between the end taps. This research demonstrated that the voltage-dividing potentiometer measurements can be corrected to provide accurate position results using a term $\delta L$ that accounts for the effective shortening of the bridge length when the taps have finite widths relative to the bridge length. This correction eliminates the restriction on the minimum size of a voltage-dividing potentiometer that can be used to make reliable position measurements electrically.

In addition, it was determined in the research that the shape of the "corners" where the taps contact or intersect the bridge affects voltage-dividing potentiometer results when the potentiometers are small relative to the widths of the bridge and the taps. When those corners lack a particular symmetry, taps on opposite sides of the bridge may have different $\delta L$ correction terms, increasing the complexity of interpreting potentiometer measurements. This reported research showed that by placing the end and center taps on the same side of a bridge, the center-to-center spacing between a center tap and the end taps of a single potentiometer can be determined electrically with a residual error below ten nanometers.

The foregoing research concerning voltage-dividing potentiometers is reported in Cresswell et al "A Modified Sliding Wire Potentiometer Test Structure For Mapping Nanometer-Level Distances", *Proceedings of IEEE* 1991 *International Conference on Microelectronic Test Structures*, pages 129–134 (1991); Allen et al, "Elimination Of Effects Due To Patterning Imperfections In Electrical Test Structures For Submicrometer Feature Metrology", *Solid-State Electronics*, Volume 35, pages 435–442 (1992); Allen et al, "Voltage-Dividing Potentiometer Enhancements For High-Precision Feature Placement Metrology", *Proceedings of IEEE* 1992 *International Conference on Microelectronic Test Structures*, pages 174–179 (1992), and Allen et al, "A New Test Structure For The Electrical Measurement Of The Width Of Short Features With Arbitrarily Wide Voltage Taps", *IEEE Electron Device Letters*, Volume 33, pages 322–324 (1992). These publications are each incorporated herein by reference.

While the voltage-dividing potentiometer provides a simple means for electrical measurement the position of an electrically conducting artifact on a substrate, the sensitivity of the measurement declines when the spacing between artifacts, e.g., end and center taps, reaches distances on the order of one millimeter and greater, for example, across spans on large chips and particularly near opposite edges of a DRAM chip thirty millimeters by thirty millimeters in size. Optical measurements are effective in determining the positions of images that are widely spaced on a substrate. However, as already discussed, the cost of the optical measurement apparatus is very high and the time required to measure one substrate is very long. The substantial delay required to confirm mask accuracy before placing the tested sample and similarly prepared masks into production is incompatible with efficient LSI manufacturing operations.

Accordingly, it would be desirable to provide a method of and articles for measuring the relative positions of relatively widely spaced electrically conducting artifacts on a substrate to an accuracy of ten nanometers or better using an electrical technique, such as the voltage-dividing potentiometer technique, that can be carried out quickly at a wafer fabrication and mask manufacturing site at relatively low cost using lithography tools and electrical test apparatus present at the wafer fabrication site.

SUMMARY OF THE INVENTION

According to one aspect of the invention, a prepatterned potentiometer precursor includes a precursor substrate; and at least two spaced apart potentiometer precursor patterns on the substrate, each potentiometer precursor pattern including a bridge, two substantially similar end taps transverse to and extending from the bridge, and a center tap transverse to and extending from the bridge and centrally disposed between the end taps wherein the center taps of the bridges are substantially parallel to each other and are substantially wider than the end taps.

A method according to the invention of determining the distance between test features of test patterns on a test piece includes preparing a precursor substrate including at least two electrically conducting spaced apart potentiometer precursor patterns, each potentiometer precursor pattern including a bridge, two substantially similar end taps transverse to and extending from the bridge, and a center tap transverse to and extending from the bridge and centrally disposed between the end taps, wherein the center taps of the bridges of each of the potentiometer precursor patterns are substantially parallel to each other and are substantially wider than the end taps; measuring the positions of the end taps on the precursor substrate relative to each other to a prescribed degree of accuracy, applying a resist film responsive to an incident energy beam to the precursor substrate covering the potentiometer precursor patterns; preparing a test piece mask including a test substrate and at least two test patterns having test features complementary to the respective center taps of the potentiometer precursor patterns on the test substrate wherein the test substrate is transparent to an energy beam to which the resist film is responsive and the test patterns are defined by a material opaque to the energy beam; using the test substrate as a mask in a lithography apparatus, projecting an image of the test patterns on the resist film with the energy beam and thereby printing an overlay of the test patterns on the resist film and defining parts of the center taps of the potentiometer precursor patterns to be removed; developing the resist film and removing parts of the center taps to narrow the center taps and thereby define two potentiometers, each potentiometer including a bridge, two end taps, and a center tap; and electrically determining the positions of each of the center taps of the potentiometers relative to the end taps of the respective potentiometers, thereby determining the distance between the center taps of the two potentiometers and the distance between the test features on the test piece.

Another method according to the invention of determining the distance between test features of test patterns on a test piece includes applying a resist film responsive to an energy beam to a metal film disposed on a measuring substrate; preparing a precursor substrate including at least two electrically conducting spaced apart potentiometer precursor patterns, each potentiometer precursor pattern including a bridge, two substantially similar end taps transverse to and extending from the bridge, and a center tap transverse to and extending from the bridge and centrally disposed between the end taps wherein the center taps of the bridges of each of the potentiometer precursor patterns are substantially parallel to each other and are substantially wider than the end taps, wherein the precursor substrate is transparent to the energy beam to which the resist film is responsive and the potentiometer precursor patterns are defined on the substrate by a material opaque to the energy beam; measuring the positions of the end taps on the precursor substrate relative to each other to a prescribed degree of accuracy; preparing a test piece projection mask including a test substrate and at least two test patterns having features complementary to the respective center taps of the potentiometer precursor patterns on the test substrate wherein the test substrate is transparent to the energy beam to which the resist film is responsive and the test patterns are defined by a material opaque to the energy beam; using the precursor substrate as a mask in a lithographic apparatus, projecting an image of the potentiometer precursor patterns on the resist film with the energy beam and thereby printing the potentiometer precursor patterns on the resist film; using the test substrate as a mask in the lithography apparatus, projecting an image of the test patterns on the resist film with the energy beam and thereby printing an overlay of the test patterns on the resist film and defining parts of the center taps of the potentiometer precursor patterns to be removed; developing the resist film and removing parts of the center taps to narrow the center taps and define two potentiometers, each potentiometer including a bridge, two end taps, and a center tap; and electrically determining the positions of each of the center taps of the potentiometers relative to the end taps of the respective potentiometers, thereby determining the distance between the center taps of the two potentiometers and the distance between the test features on the test piece.

According to yet another method of the invention of determining the accuracy of electron beam scanning of test patterns including test features on a substrate includes preparing a precursor substrate including at least two electrically conducting spaced apart potentiometer precursor patterns, each potentiometer precursor pattern including a bridge, two substantially similar end taps transverse to and extending from the bridge, and a center tap transverse to and extending from the bridge and centrally disposed between the end taps, wherein the precursor substrate is transparent to the energy beam to which the resist film is responsive and the potentiometer precursor patterns are defined on the substrate by a material opaque to the energy beam; measuring the positions of the end taps on the precursor substrate relative to each other to a prescribed degree of accuracy; applying a resist film responsive to an electron beam to the precursor substrate covering the potentiometer precursor patterns; exposing the resist film with an electron beam scanned across the resist film in a test pattern including test features complementary to the center taps of the potentiometer precursor patterns to print an overlay of the test patterns on the resist film and to define parts of the center taps of the potentiometer precursor pattern to be removed; developing the resist film and removing parts of the center taps to narrow the center taps and define two potentiometers, each potentiometer including a bridge, two end taps, and a center tap; and electrically determining the positions of each of the center taps of the potentiometers relative to the end taps of the respective potentiometers, thereby determining the accuracy of electron beam scanning of the precursor substrate.

DETAILED DESCRIPTION OF PREFERRED EMBODIMENTS

Figure 3:
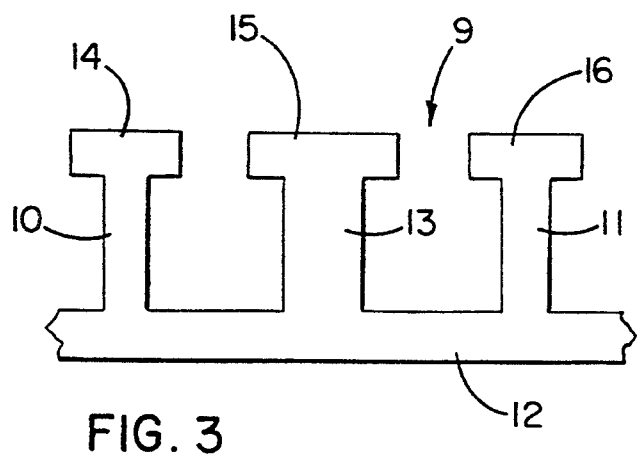
FIG. 3 is a plan view of the geometry of a prepatterned potentiometer precursor according to a preferred embodiment of the invention.

FIG. 3 is a plan view of the geometry of a potentiometer precursor pattern 9 according to an embodiment of the invention. What is shown in FIG. 3 is the perimeter of a pattern that is disposed on a substrate (not shown). When the precursor is a mask employed in a projection lithography process as described in more detail below, the substrate supporting the precursor transmits the energy used in the lithographic process. The precursor pattern 9 is then defined by a material that does not transmit the energy. The pattern may be the non-transmissive material on the transmissive substrate or the non-transmissive material may lie outside the pattern, leaving the pattern as the only energy transmissive portion of the mask. In other instances, when the prepatterned potentiometer precursor is not a mask, the precursor pattern 9 is a metal layer that is disposed on a substrate (not shown in FIG. 3) and that metal fills the pattern up to the perimeter shown in FIG. 3. The geometry of the precursor pattern 9 includes end taps 10 and 11 extending transverse to a bridge 12. A center tap 13 is wider than either of the end taps 10 and 11 and is centrally disposed between those end taps 10 and 11. Each of the end taps and the center tap includes a probe pad 14, 15, and 16, respectively, for making electrical measurements when a potentiometer is formed from the precursor. Not shown in FIG. 3 are similar pads at the ends of the bridge 12 through which current is supplied to flow through the bridge and to produce the voltage division that is determined through probes applied to pads 14, 15, and 16 of a completed potentiometer prepared from the precursor.

Figure 4:
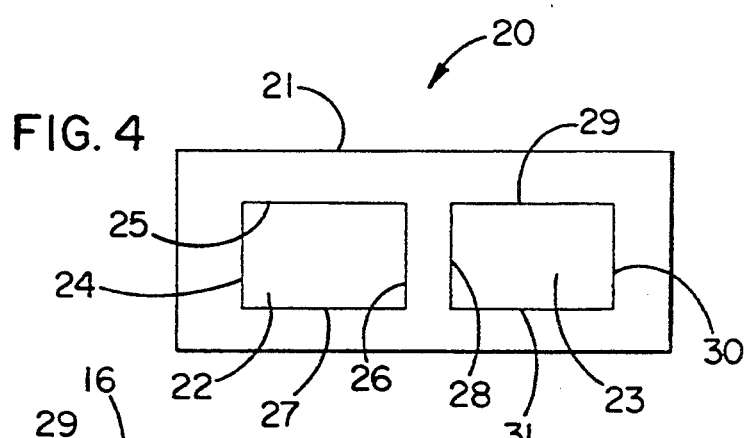
FIG. 4 is a plan view of the geometry of a test piece pattern for forming a potentiometer in conjunction with a prepatterned potentiometer precursor geometry of FIG. 3.

FIG. 4 is a schematic, partial plan view of the geometry of a test piece pattern 20 that is complementary to and used in conjunction with the potentiometer precursor 9 to prepare a potentiometer. The electrical position measurements made with the completed potentiometer disclose the position of a feature of the test piece relative to similar features elsewhere on the test piece, as described below. The test piece pattern 20 includes two generally rectangular parts 22 and 23. The rectangular parts 22 and 23 have respective sides 24–27 and 28–31. The opposite sides 26 and 28 define between them a test feature that is complementary to a center tap of a potentiometer precursor. The test piece pattern 20 is shown in FIG. 4 as including a substrate 21. The substrate 21 is differentiated from the rectangular parts 22 and 23 by their transmissivity relative to an energy beam. The rectangular parts 22 and 23 are defined by non-transmitting material either only within the parts or only outside and defining the parts 22 and 23. In other words, the article depicted in FIG. 4 is a lithographic mask, i.e., a shadow mask, used to form an image by the passage of energy through the transmissive parts of the test piece pattern 20 either within or outside parts 22 and 23.

In a method according to the invention, the test piece pattern 20 of FIG. 4 is lithographically overlaid on the potentiometer precursor 9 so that the patterns partially overlap. The overlapped part of the potentiometer precursor is removed in processing following the lithographic image formation step. The result of that overlay, schematically depicted in FIG. 5 as a potentiometer, is achieved in a process explained in greater detail below. The edges 24 and 30 of the parts 22 and 23 are opposite respective edges of the end taps 10 and 11. Edges 27 and 31 overlay a part of the bridge 12. Likewise, and most importantly, the edges 26 and 28 defining the test feature protrude into and overlay part of the center tap 13.

The overlay of the test piece pattern 20 on the potentiometer precursor 9 is carried out so that the center tap 13' of the potentiometer that is produced in an electrically conducting layer is narrowed as compared to the center tap 13 of the potentiometer precursor pattern. Generally, as described below, by exposure to an energy beam using the test piece pattern 20 as a mask, part of an energy-responsive resist film covering the center tap 13 is affected and selectively removed, for example, by etching, so that the narrowed center tap 13' of a potentiometer is produced. In narrowing the center tap, depending upon the particular shape of parts 22 and 23 of the test piece pattern 20, and those parts are not restricted to a rectangular shape, at least a part of the bridge 12 in the vicinity of the center tap may be narrowed or may have portions removed. This narrowing or changing of shape of part of the bridge 12 does not adversely affect the results provided by the invention.

Figure 1:
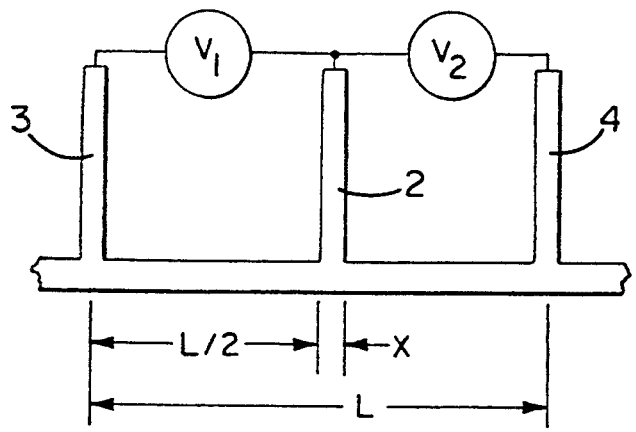
FIG. 1 is a schematic diagram illustrating the principle of a potentiometer for determining the position of a center tap relative to the end taps of the potentiometer.
Figure 2:
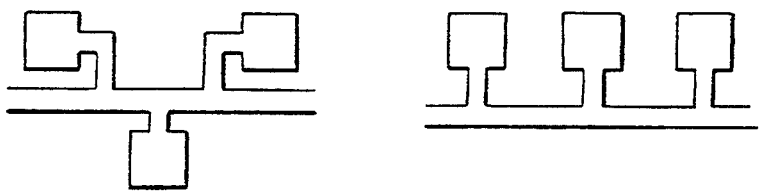
FIG. 2 is an illustration of four different kinds of potentiometers that may be employed in electrically determining the position of a center tap relative to end taps of the potentiometer.
Figure 5:
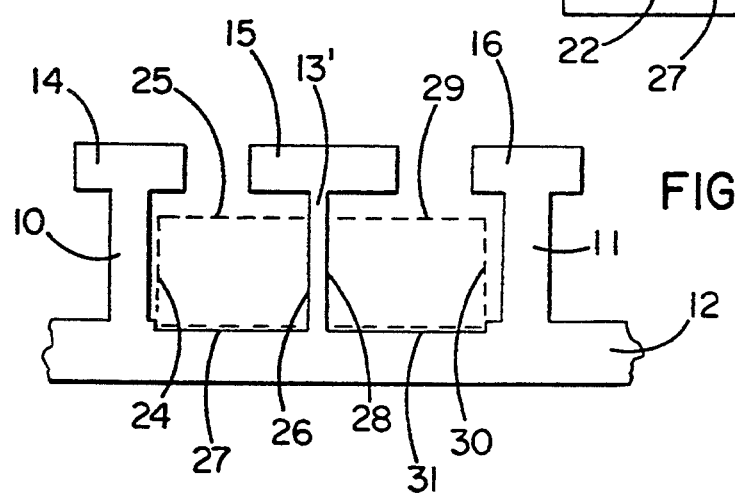
FIG. 5 is a plan view of a potentiometer according to an embodiment of the invention prepared after overlaying the test piece pattern of FIG. 4 on the potentiometer precursor of FIG. 3.
Figure 6:
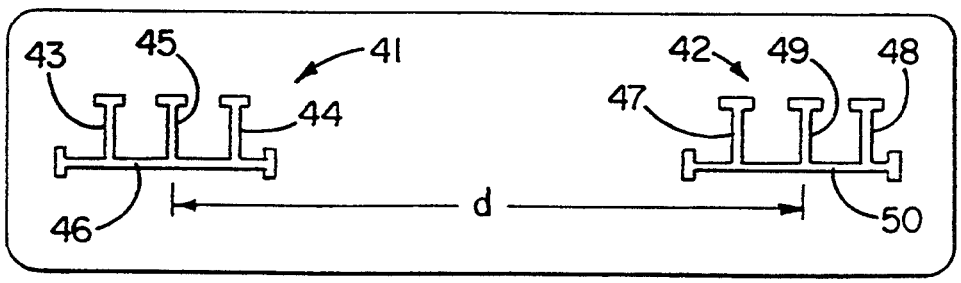
FIG. 6 is a plan view of two of the potentiometers of FIG. 5 widely spaced on a substrate illustrating a measurement method according to the invention.

The potentiometer of FIG. 5 is different in several respects from the geometries of the potentiometers of FIG. 2. The end taps 10 and 11 have substantially or exactly the same width and, therefore, both have the same associated correction term δL to account for the effective shortening of the bridge length when the bridge is relatively short compared to the widths of the taps. However, because the center tap 13' is not the same width as the end taps 10 and 11, its correction term, accounting for the effective shortening of the bridge length, is different from the correction term for the end taps 10 and 11. At least two of the potentiometers of FIG. 5, that are preferably formed simultaneously to have the same differential displacements, are used together, as shown in FIG. 6. The differential displacement relates to errors in the replication of the potentiometers and potentiometer precursors. A constant differential displacement for the potentiometer precursors and potentiometers has been found to be achieved if the internal corner rounding, i.e., the shape of the intersections of the taps with the bridge, is translationally uniform from potentiometer-to-potentiometer, the bridge shortening correction terms for the end taps of the two potentiometers are the same, and the correction terms for the center taps are the same. As explained below, under these conditions, the distances between the ends taps of the two potentiometers can be measured with an error of less than ten nanometers over widely spaced apart potentiometers. That measurement indicates distances between corresponding features on a test piece.

FIG. 6 is a highly schematic drawing illustrating a measuring substrate 40 on which potentiometers 41 and 42 have been formed in one of the several different kinds of processes described below using a prepatterned potentiometer precursor and a test piece pattern of the type shown in FIGS. 3 and 4, respectively. The potentiometers 41 and 42 are artifacts on the measuring substrate 40 formed from an electrically conducting film in a lithographic process in which two test piece patterns have been overlaid on two corresponding potentiometer precursor patterns. Potentiometer 41 includes end taps 43 and 44, a center tap 45, and a bridge 40. Potentiometer 42 includes end taps 47 and 48, a center tap 49, and a bridge 50. The conductors comprising the center and end taps are generally parallel to each other and the bridges are generally colinear. As schematically suggested in FIG. 6, the two potentiometers 41 and 42 are very widely spaced apart relative to the dimensions of the potentiometers. The distance d between the center lines of the center taps 45 and 49 is the parameter that is usefully determined in a method according to the invention. That distance, in turn, reveals the degree of error in the location of the test features of a mask including two of the test piece patterns of FIG. 4.

An important aspect of the invention lies in the formation of the prepatterned potentiometer precursors in a first step followed by a second step of narrowing the wide center taps of the precursor using the test piece patterns. The two steps can be and usually are carried out at significantly different times and at different locations. First, at least two prepatterned potentiometer precursors are prepared on a precursor substrate and the relative positions of end taps of the precursors are accurately measured using sophisticated optical equipment. In general, a plurality of many more than two prepatterned potentiometer precursors is formed on a substrate, such as substrate 40, or is transferred to a substrate 40 in a lithographic or another printing process. Then the relative positions of the end taps of the potentiometers is measured to a predetermined degree of error. The accuracy of these optical measurements should be at least as good as and preferably better than the accuracy to which the distance between test features of the test piece is to be determined.

The arrangement of potentiometer precursors and the test piece patterns are coordinated so that the test features of the test piece patterns will generally align with the wide center taps of corresponding potentiometers when the patterns are overlaid. The coordinated test features and center taps are described as complementary. The complementary test features can be generally aligned with the wide center taps. However, exact alignment is not achieved. The degree of misalignment is determined in the novel method, revealing the accuracy of the positioning of the test piece patterns. That position accuracy information forms the basis for determining the placement accuracy of other features on a test piece, i.e., a mask including an array of test piece patterns.

Once those position measurements of the precursors have been completed, if the potentiometer precursors are not already metallic, i.e., electrically conducting patterns, then such electrically conducting patterns are formed on a substrate in a printing process, such as photolithography. Thereafter, the corresponding test piece with a test piece pattern and test piece features corresponding to respective precursors is employed to narrow the width of the respective center taps of the potentiometers. Upon the completion of that step, the position of each center tap relative to the end taps is determined electrically using the techniques described in the publications cited above. Once the position of each center tap relative to the positions of the end taps of the same potentiometer is known, then the distances between center taps of pairs of widely spaced apart (and even closely spaced) potentiometers can be determined, essentially using arithmetic. In making that determination, as described above, the correction terms δL accounting for the finite width of the end taps of each pair of potentiometers should be the same, and the similar correction term for the center taps for each pair of potentiometers should likewise be the same or nearly identical, although the correction terms are different for the center taps and the end taps. In addition, the internal corner rounding for each pair of potentiometers should be translationally uniform. In the determination of the distances, such as distance d of FIG. 6, obtained by subtracting relative position data, the effects of the respective correction terms, unusual internal corner shapes, and the like essentially compensate and either cancel each other or have only a second order effect on accurate determination of the distance d if, as described, the respective differential displacements of the pairs of potentiometers are identical or nearly identical. Of course, it is still preferable to determine and confirm that the bridge length shortening correction terms for the end taps and the center taps are, respectively, at least nearly identical and to confirm the translational uniformity of internal corner rounding so that the distance determination is known to be reliable.

Figure 7A:
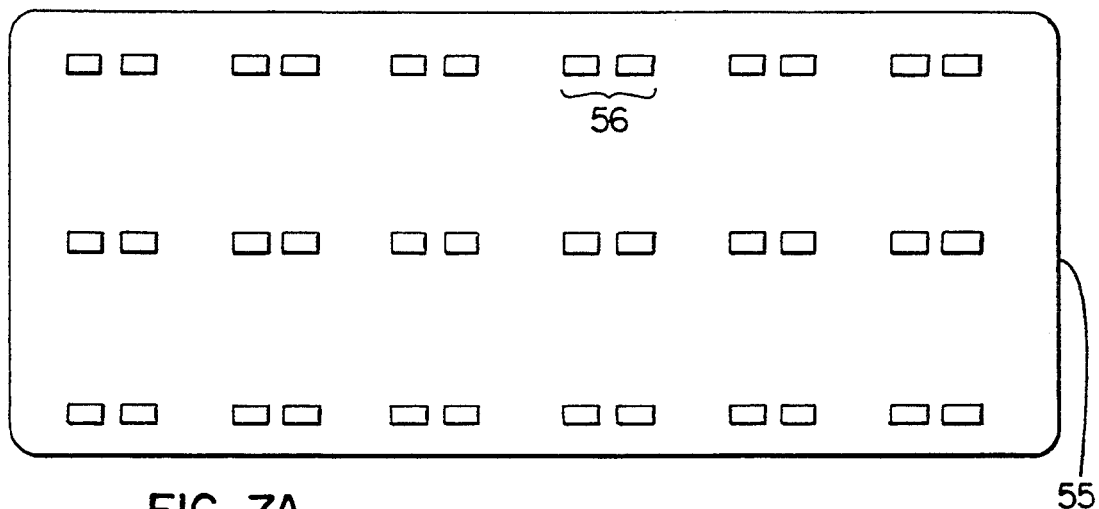
FIG. 7A is a plan view of a test piece substrate including a grid of test piece patterns employed in conjunction with a grid of prepatterned potentiometer precursors to produce a plurality of potentiometers on a substrate according to an embodiment of the invention and FIG. 7B is a plan view of a precursor substrate including a grid of prepatterned potentiometer precursors employed in conjunction with a grid of test piece patterns to produce a plurality of potentiometers on a substrate according to an embodiment of the invention.

In various applications of the novel method and associated articles, an actual test piece 55, as shown in FIG. 7A, includes multiple test patterns and test features. That test piece 55 includes a large number of pairs of parts 56, each pair defining an intervening test feature, arranged in a grid. The test feature is the area between the parts 56 that defines the portion of a widened center Tap that is left in place when the center tap is narrowed in the formation of a potentiometer. When the test piece 55 is a photolithographic mask of the type employed in LSI manufacture, then the areas adjacent the parts 56 are occupied by patterns of one of the multiple layers of patterns employed in the processing. In that instance, the parts 56 occupy only a very small portion of the mask and are placed in locations that do not interfere with the formation of circuit elements.

Figure 7B:
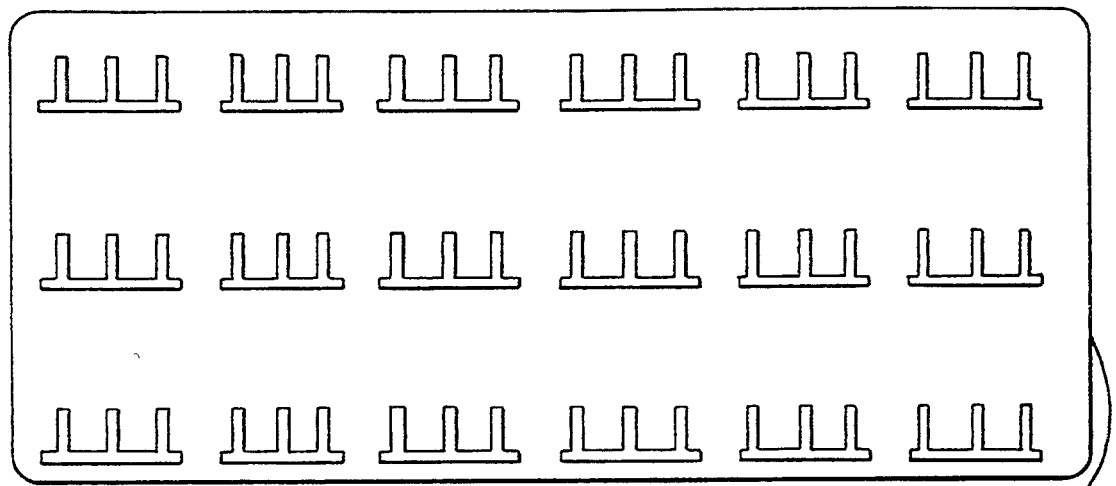

The corresponding prepatterned potentiometer precursor 58 shown in FIG. 7B includes a similar arrangement of potentiometer precursors on a precursor substrate so that the test feature between each pair of parts 56 will correspond to and align with one of the center taps 13 of the potentiometer precursor patterns. If the alignment is perfect and each center tap, after narrowing as shown in FIG. 5, is exactly centered between respective end taps 10 and 11, then the electrical measurements with the potentiometer will reveal the perfect centering of the center taps. On the other hand, if there are misalignments, the narrowed center tap of each potentiometer will be shifted toward one or the other of the end taps. That shift will be revealed in the electrical measurements using the potentiometer. This method discloses positioning errors in the test piece across large spans corresponding to large semiconductor chips and corresponding even across different semiconductor chips on a single wafer. For example, distances separating test features can be measured with an accuracy better than ten nanometers over distances greater than one millimeter and up to at least tens of millimeters with the invention, meeting the needs of future LSI production. Of course, FIGS. 7A and 7B are highly schematic. Most semiconductor wafers are circular and precursor substrates and test piece pattern substrates would have shapes that match the wafer or a chip on a wafer in application of the invention to semiconductor processing technology. In a typical example of the invention, a potentiometer precursor and potentiometer have line widths of one to two micrometers in the bridge and end taps. The wide center tap may be about five micrometers wide and be narrowed to about two microns. The overall length of the bridge may be about twenty microns or less. Using optical metrology apparatus available at NIST, the relative positions of the end taps can be determined with an error of five to eight nanometers. Applying the invention, distances between center taps over long spans, spans of millimeters, have been measured electrically that agree with optical calibrations within less than twenty nanometers and in many instances agree exactly with the optical measurements.

In the following discussion of specific methods of applying the invention, the parts 22 and 23 in the test piece 20 and the parts 56 of the test piece 55 are considered to be energy transmissive and the resist films to be positive-type resist films. However, as known to one of skill in the art, the mask or masks may be reversed from the specific description when the resist film used is a negative-type resist film.

The foregoing and following discussion is particularly directed to applying the invention to LSI manufacture. However, the invention may be applied to the production of any article in which the spacing over a relatively long span needs to be very accurately determined. For example, in the production of x-y microscope stages, prepatterned potentiometer precursors can be used in conjunction with test pieces of the type described to calibrate the x-y stages.

Figure 9:
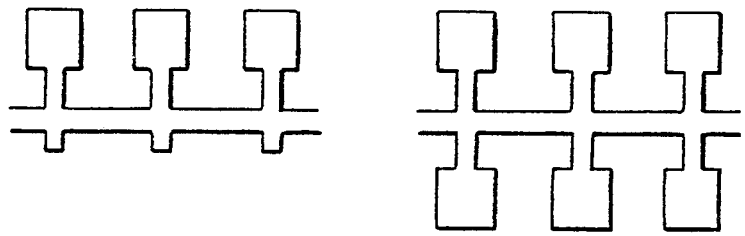
FIG. 9 is a schematic view of an electron beam lithography apparatus for carrying out a method according to the invention.
Figure 9:
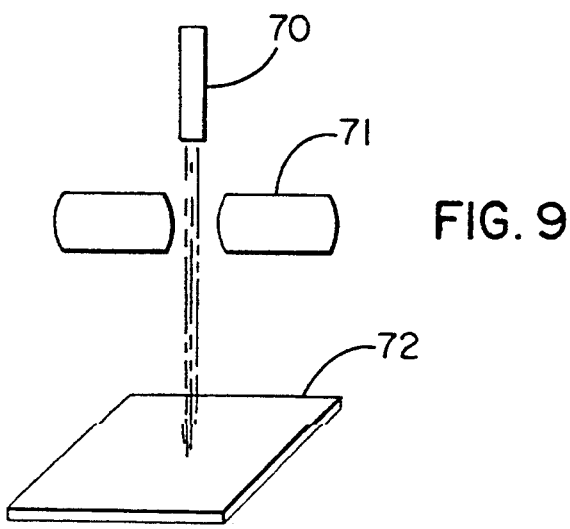
Figure 8:
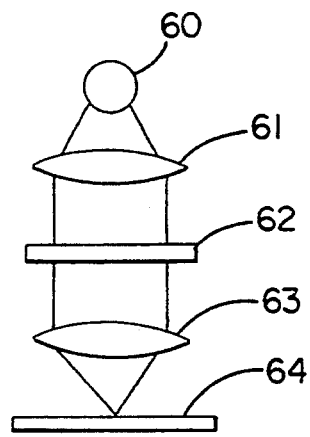
FIG. 8 is a schematic illustration of an optical lithography apparatus for carrying out methods according to the invention.
Figure 10:
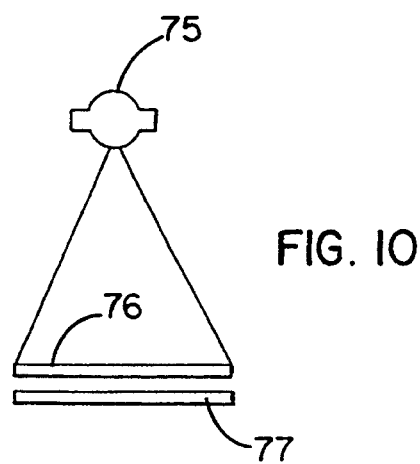
FIG. 10 is a schematic view of an x-ray lithography apparatus for carrying out a method according to the invention.

The prepatterned potentiometer precursor substrate 58 may be used with a corresponding test piece 55 in a variety of methods illustrated in FIGS. 8–10. FIG. 8 is a highly schematic diagram of a photolithographic apparatus in which light is the energy beam that exposes a photoresist. The apparatus includes a light source 60 which may be a source of visible or ultraviolet light. A focusing system, schematically illustrated as a single lens 61, forms a collimated light beam that falls on a shadow mask 62 including transparent and opaque regions in a predetermined pattern depending upon the use made of the apparatus. The light passing through the transparent parts of the mask 62 is focused by the lens 63 onto a substrate 64. Typically, the substrate 64 includes a photoresist film coating that is responsive to the incident light and changes chemical characteristics as a result of light exposure. The photolithographic apparatus of FIG. 8 may be employed with the test piece 55 and the prepatterned substrate 58 in at least two different embodiments of the novel method.

In a first example, the substrate 64 has a metal coating covered by a photoresist film. The photoresist film is initially exposed with the precursor substrate 58 used as the mask 62. In that instance, it is not necessary that the potentiometer precursor pattern on the precursor substrate 58 be formed from an electrically conducting material. Rather, it is only essential that the potentiometer precursor pattern and its surroundings be reciprocal in light transmissivity. In other words, either the potentiometer precursor pattern is opaque and the surroundings are transparent or vice versa, depending upon the type of photoresist film employed. After exposure of the photoresist film on the substrate 64 using the precursor substrate 58 as a mask 62, the complementary test piece 55 is used as the mask 62. Then, the photoresist film is subjected to a second exposure. For that second exposure, the complementary test piece features are generally aligned with the center taps of the corresponding potentiometers. In the second exposure, the test pattern is overlaid and "printed" on the wide center taps to define parts of the wide center taps to be removed.

Following that second exposure step, the photoresist film is developed and the metal film on the substrate 64 is etched to define a plurality of spaced apart potentiometers like the potentiometer of FIG. 5 as artifacts on the substrate 64. Subsequently, electrical measurements are carried out to determine the relative positions of center taps with respect to end taps of the potentiometers. The relative end tap positions of the potentiometers are known from the optical calibration of the precursor substrate 58. From this known position information, the distance between the center taps of the two potentiometers can be determined to an accuracy of better than ten nanometers provided the magnification or reduction factor of the photolithographic apparatus is well known and the relative positions of the end taps of the potentiometer precursor patterns are known to better than ten nanometers. That level of accuracy is readily achievable with optical or other metrological apparatus currently in use at NIST.

The foregoing method has the advantage that the prepatterned precursor substrate 58 can be repeatedly used because it is not damaged nor changed in performing the method. The precursor substrate is used only as a lithographic mask. On the other hand, because the prepatterned substrate is used only as a mask, the magnification or reduction factor of the lithographic apparatus must be well known in order to make absolute distance measurements with the desired level of accuracy. The effect of the magnification or reduction factor of the lithographic apparatus may be eliminated if the calibrated prepatterned potentiometer precursor is used directly to produce the artifact as in the following example.

In a second example, the prepatterned precursor substrate 58 is covered with a photoresist film and used as the substrate 64 of FIG. 8. Unlike the previously described method in which the calibrated substrate is used as a mask to form potentiometer precursors as artifacts on a substrate, in the second example, the potentiometer precursors are directly present on the substrate 64 and must be electrically conducting. The test piece 55 is then placed in the position 62 of FIG. 8, aligned with the complementary center taps of the potentiometers, and is used as a mask. Again, by exposure, the test piece patterns are overlaid on and printed on the photoresist film, defining parts of the center taps that are to be removed in subsequent steps. The same development and etching steps as before are used to define a plurality of potentiometers like the potentiometer shown in FIG. 5 on the prepatterned precursor substrate 58. Since that substrate 58 has been directly optically calibrated, the placement of the test features on the test piece 55 can be determined provided the magnification or reduction factor of the lithographic apparatus is well known and taken into account. Since, unlike the first example, the test piece pattern, but not the potentiometer precursor pattern, is projected onto the precursor substrate 58 with that magnification or reduction factor, correlation of relative position information with absolute positions is more complicated. In this example, the prepatterned precursor substrate 58 can be used only once because it is altered when the center taps are narrowed.

In still another example, illustrated in FIG. 9, the novel method may be applied to electron beam lithography. FIG. 9 is a highly schematic diagram of an electron beam lithography apparatus including an electron beam source 70, a means 71 of steering the electron beam, and a substrate 72 on which the electron beam is incident. As in the previously described example, the prepatterned substrate 58 is covered with a resist film that is responsive to electron beam radiation and is used as the substrate 72. The electron beam from the source 70 is electrically steered to trace a test pattern, corresponding to the test pattern appearing on test piece 55, on the substrate 72. No test piece substrate 55 is used. The resist film is directly exposed by the electron beam. Thereafter, through development of the resist film and removal of parts of the center taps of the potentiometer precursor patterns on the substrate 72, the accuracy of the test pattern traced by the electron beam is determined from electrical measurements using the potentiometers. As in the previously described process, the prepatterned substrate is sacrificed in determining the accuracy of the electron beam irradiation of the substrate. However, since electron beam exposure directly writes on the resist, there is no magnification nor reduction factor to be included in the dimensional determinations.

Still another method according to the invention is illustrated in FIG. 10. There, a point x-ray source 75 provides x-ray energy through a mask 76 to expose a substrate 77. (A collimated x-ray source may be used in place of the point source 75.) The mask 76 is disposed very close to and almost in contact with the substrate 77 in order to faithfully reproduce the pattern of mask 76. An x-ray resist film is deposited on the substrate 77. Unlike light in the photolithography apparatus of FIG. 8 and the electron beam of the apparatus of FIG. 9, x-rays can neither be focused nor steered by conventionally available technology. Thus, in this embodiment of the invention, the mask 76 corresponds to the test piece 55 and the substrate 77 corresponds to the prepatterned precursor substrate 58. The processes carried out for exposure, development, and measurement are the same as in the second example described above. Again, the prepatterned potentiometer precursor substrate is sacrificed during etching to define potentiometers with narrowed width center taps.

In each of the examples described above, a metal film has a pattern of a resist film formed on it and the metal film is etched to narrow the width of the center taps of potentiometer precursors. In the first example described with respect to the photolithography apparatus of FIG. 8, a lift-off process can be employed to form the potentiometers with narrow center taps. When a lift-off process is used, the prepatterned potentiometer precursor substrate is first employed to define the potentiometer precursor pattern in a resist film on a substrate 64. Thereafter, in the subsequent exposure step employing the test piece 55 as the mask 62, a second exposure of the resist film is carried out. The photoresist film is removed only where it receives one or more exposures. Thereafter, a metal film is deposited on the exposed portion of the substrate and the remaining photoresist film. Finally, the excess metal overlaying the photoresist film is removed with a solvent for the resist film, leaving in place the potentiometers with narrowed center taps.

In some of the publications described above, potentiometers have been evaluated and it has been determined that, in small potentiometers, the shapes of the intersections of the bridge with the taps, i.e., the corners, can have a significant effect on the error in dimensional measurements made electrically. In at least one of the publications, it is stated that, in order to ensure accurate measurements, the potentiometer arrangement in the upper left corner of FIG. 2 should be avoided in favor of the other potentiometer arrangements shown in FIG. 2. The source of error observed and overcome in that publication is a lack of a particular symmetry in the internal corner rounding, i.e., the shape of the intersections of the bridge and the taps. This source of error is avoided in the invention provided the end taps of all of the potentiometers are translationally symmetrical and that the center taps of all of the potentiometers are likewise translationally symmetrical. Thus, any of the potentiometer configurations of FIG. 2 can be employed in the invention if the translational symmetry requirement is achieved. That requirement is generally achieved if the entire area of each substrate is simultaneously processed in printing and chemical processing steps.

In each of the foregoing examples, particularly the embodiment of the test piece of FIG. 7A and the prepatterned potentiometer precursor of FIG. 7B, all of the potentiometers have been aligned along a single direction. When two-dimensional directions are to be measured, potentiometers are aligned along each of the directions. In addition, potentiometers having components along two orthogonal directions can be prepared.

Figure 11:
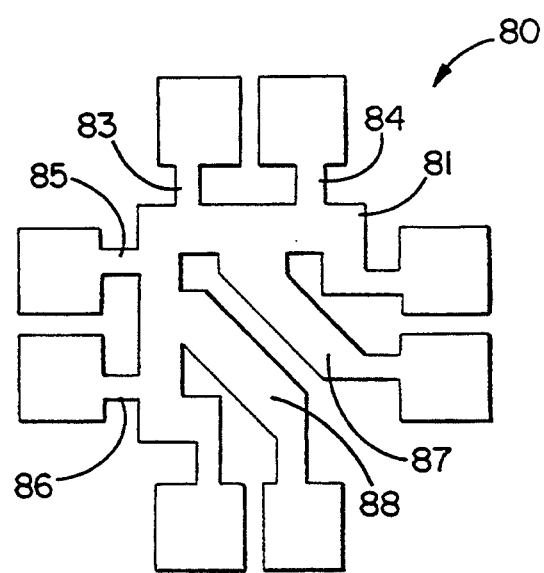
FIG. 11 is a plan view of a potentiometer precursor pattern according to an alternative embodiment of the invention.
Figure 12:
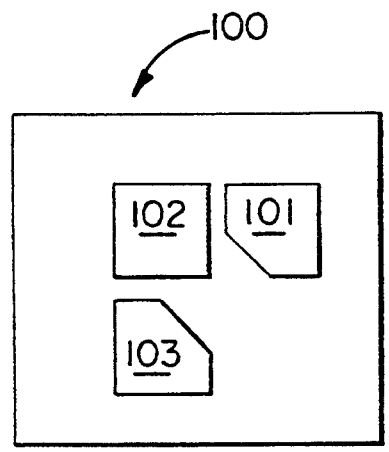
FIG. 12 is a plan view of a test piece pattern for use with the potentiometer precursor pattern of FIG. 11 to produce a potentiometer according to another embodiment of the invention.
Figure 13:
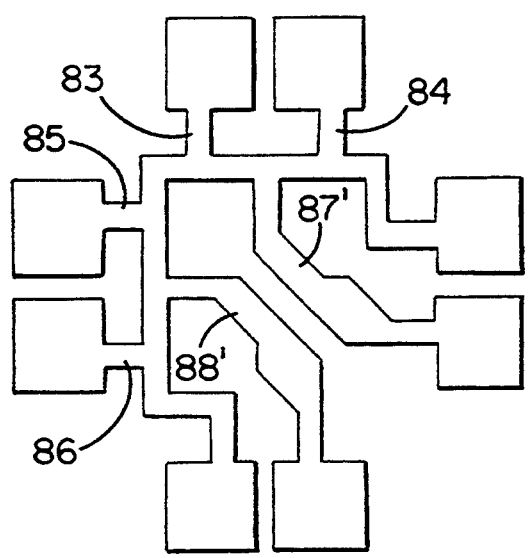
FIG. 13 is a plan view of a potentiometer according to an embodiment of the invention prepared after overlaying the test piece pattern of FIG. 12 on the potentiometer precursor pattern of FIG. 11.

Examples of two-dimensional potentiometer patterns, test patterns, and potentiometers are respectively shown in FIGS. 11, 12, and 13. The potentiometer pattern 80 of FIG. 11 includes two orthogonal intersecting bridges 81 and 82. Probe pads at the distal ends of the bridges are used to supply current that flows through both bridges. Bridge 81 has extending from it end taps 83 and 84 with associated probe pads. Likewise, bridge 82 has extending from it end taps 85 and 86. A center tap 87 extends from and transverse to bridge 81 and a center tap 88 extends from and transverse to the bridge 82. Each center tap has an associated probe pad. As in the one-dimensional embodiments, the center taps 87 and 88 are much wider than the end taps of the respective bridges. Other probe pads connected to bridges 81 and 82 are not shown in FIG. 11.

In the embodiment of FIG. 11, the center taps are disposed on the opposite side of the respective bridges from the end taps. As discussed above, although that arrangement introduced errors in measurements with single potentiometers, so long as translational symmetry is maintained between the respective end taps and center taps of aligned potentiometers, the arrangement of taps on opposite sides of the bridges does not introduce significant errors into the measurement results.

FIG. 12 is a plan view of a part of a test pattern 100 for use in combination with the precursor pattern 80 of FIG. 11. The test pattern 100 includes parts 101, 102, and 103 defining test features between respective pairs of those parts. It is those test features that define the final width of the center taps after narrowing. The potentiometer precursor 80 and the test pattern 100 are used in the same manner that the potentiometer precursors and the test patterns were used in the examples described above. The result of applying those methods is the two-dimensional potentiometer shown in partial plan view in FIG. 13. The important differences between the potentiometer precursor pattern 80 of FIG. 11 and the potentio meter of FIG. 13 is the narrowed center taps 87' and 88' formed as a result of the resist film exposure, development, and metal film etching steps described above for the simpler one-dimensional potentiometers.

The invention has been described with respect to certain preferred embodiments. However, various modifications and additions will be apparent to those of skill in the art from the foregoing description. Accordingly, the scope of the invention is limited solely by the following claims.

We claim:

1. A prepatterned potentiometer precursor including:
a precursor substrate; and
at least two spaced apart potentiometer precursor patterns on the substrate, each potentiometer precursor pattern including a bridge, two substantially similar end taps transverse to and extending from the bridge, and a center tap transverse to and extending from the bridge and centrally disposed between the end taps wherein the center taps of the bridges are substantially parallel to each other and are substantially wider than the end taps.

2. The precursor of claim 1 wherein the center taps of the potentiometer precursor patterns are separated by at least one millimeter.

3. The precursor of claim 1 wherein the precursor substrate and the potentiometer precursor patterns are transparent and including an opaque material disposed on the substrate defining the potentiometer precursor patterns.

4. The precursor of claim 1 wherein the precursor substrate is transparent and the potentiometer precursor patterns are opaque.

5. The precursor of claim 1 wherein the potentiometer precursor patterns are electrically conductive.

6. The precursor of claim 1 wherein the positions of the end taps on the precursor substrate relative to each other have been measured with an error or no more than ten nanometers.

7. The precursor of claim 1 in combination with a test piece including a test substrate having at least two spaced apart test patterns on the test substrate defining test features in positions complementary with the positions of the respective center taps of the potentiometer precursor patterns for patterning the center taps to reduce their widths and thereby determine the spacing between the test features.

8. A method of determining the distance between test features of test patterns on a test piece comprising:
preparing a precursor substrate including at least two electrically conducting spaced apart potentiometer precursor patterns, each potentiometer precursor pattern including a bridge, two substantially similar end taps transverse to and extending from the bridge, and a center tap transverse to and extending from the bridge and centrally disposed between the end taps, wherein the center taps of the bridges of each of the potentiometer precursor patterns are substantially parallel to each other and are substantially wider than the end taps;
measuring the positions of the end taps on the precursor substrate relative to each other to a prescribed degree of accuracy;
applying a resist film responsive to an incident energy beam to the precursor substrate covering the potentiometer precursor patterns;
preparing a test piece mask including a test substrate and at least two test patterns having test features complementary to the respective center taps of the potentiometer precursor patterns on the test substrate wherein the test substrate Is transparent to an energy beam to which the resist film is responsive and the test patterns are defined by a material opaque to the energy beam;
using the test substrate as a mask in a lithography apparatus, projecting an image of the test patterns on the resist film with the energy beam and thereby printing an overlay of the test patterns on the resist film and defining parts of the center taps of the potentiometer precursor patterns to be removed;
developing the resist film and removing parts of the center taps to narrow the center taps and thereby define two potentiometers, each potentiometer including a bridge, two end taps, and a center tap; and
electrically determining the positions of each of the center taps of the potentiometers relative to the end taps of the respective potentiometers, thereby determining the distance between the center taps of the two potentiometers and the distance between the test features on the test piece.

9. The method of claim 8 wherein the potentiometer precursors are spaced apart by at least one millimeter including optically measuring the positions of the end taps on the precursor substrate relative to each other with an error of no more than ten nanometers.

10. The method of claim 9 including electrically determining the distance between the center taps of the two potentiometers with an error of no more than ten nanometers.

11. A method of determining the distance between test features of test patterns on a test piece comprising:
applying a resist film responsive to an energy beam to a metal film disposed on a measuring substrate;
preparing a precursor substrate including at least two electrically conducting spaced apart potentiometer precursor patterns, each potentiometer precursor pattern including a bridge, two substantially similar end taps transverse to and extending from the bridge, and a center tap transverse to and extending from the bridge and centrally disposed between the end taps wherein the center taps of the bridges of each of the potentiometer precursor patterns are substantially parallel to each other and are substantially wider than the end taps, wherein the precursor substrate is transparent to the energy beam to which the resist film is responsive and the potentiometer precursor patterns are defined on the substrate by a material opaque to the energy beam;
measuring the positions of the end taps on the precursor substrate relative to each other to a prescribed degree of accuracy;
preparing a test piece projection mask including a test substrate and at least two test patterns having features complementary to the respective center taps of the potentiometer precursor patterns on the test substrate wherein the test substrate is transparent to the energy beam to which the resist film is responsive and the test patterns are defined by a material opaque to the energy beam;
using the precursor substrate as a mask in a lithographic apparatus, projecting an image of the potentiometer precursor patterns on the resist film with the energy beam and thereby printing the potentiometer precursor patterns on the resist film;
using the test substrate as a mask in the lithography apparatus, projecting an image of the test patterns on the resist film with the energy beam and thereby printing an overlay of the test patterns on the resist film and defining parts of the center taps of the potentiometer precursor patterns to be removed;
developing the resist film and removing parts of the center taps to narrow the center taps and define two potentiometers, each potentiometer including a bridge, two end taps, and a center tap; and
electrically determining the positions of each of the center taps of the potentiometers relative to the end taps of the respective potentiometers, thereby determining the distance between the center taps of the two potentiometers and the distance between the test features on the test piece.

12. The method of claim 11 wherein the potentiometer precursors are spaced apart by at least one millimeter including optically measuring the positions of the end taps on the precursor substrate relative to each other with an error of no more than ten nanometers.

13. The method of claim 12 including electrically determining the distance between the center taps of the two potentiometers with an error of no more than ten nanometers.

14. A method of determining the accuracy of electron beam scanning of test patterns including test features on a substrate comprising:
preparing a precursor substrate including at least two electrically conducting spaced apart potentiometer precursor patterns, each potentiometer precursor pattern including a bridge, two substantially similar end taps transverse to and extending from the bridge, and a center tap transverse to and extending from the bridge and centrally disposed between the end taps, wherein the precursor substrate is transparent to the energy beam to which the resist film is responsive and the potentiometer precursor patterns are defined on the substrate by a material opaque to the energy beam;
measuring the positions of the end taps on the precursor substrate relative to each other to a prescribed degree of accuracy;
applying a resist film responsive to an electron beam to the precursor substrate covering the potentiometer precursor patterns;
exposing the resist film with an electron beam scanned across the resist film in a test pattern including test features complementary to the center taps of the potentiometer precursor patterns to print an overlay of the test patterns on the resist film and to define parts of the center taps of the potentiometer precursor pattern to be removed;
developing the resist film and removing parts of the center taps to narrow the center taps and define two potentiometers, each potentiometer including a bridge, two end taps, and a center tap; and
electrically determining the positions of each of the center taps of the potentiometers relative to the end taps of the respective potentiometers, thereby determining the accuracy of electron beam scanning of the precursor substrate.

15. The method of claim 14 wherein the potentiometer precursors are spaced apart by at least one millimeter including optically measuring the positions of the end taps on the precursor substrate relative to each other with an error of no more than ten nanometers.

16. The method of claim 15 including electrically determining the distance between the center taps of the two potentiometers with an error of no more than ten nanometers.

* * * * *